(12) United States Patent
Lingier et al.

(10) Patent No.: US 9,751,295 B2
(45) Date of Patent: Sep. 5, 2017

(54) METHOD FOR MANUFACTURING A LITHOGRAPHIC PRINTING PLATE PRECURSOR HAVING A PATTERNED BACK LAYER

(71) Applicant: AGFA GRAPHICS NV, Mortsel (BE)

(72) Inventors: Stefaan Lingier, Mortsel (BE); Karen Demmers, Mortsel (BE)

(73) Assignee: AGFA GRAPHICS NV, Mortsel (BE)

( * ) Notice: Subject to any disclaimer, the term of this patent is extended or adjusted under 35 U.S.C. 154(b) by 0 days.

(21) Appl. No.: 14/891,055

(22) PCT Filed: Jun. 16, 2014

(86) PCT No.: PCT/EP2014/062540
§ 371 (c)(1),
(2) Date: Nov. 13, 2015

(87) PCT Pub. No.: WO2014/202519
PCT Pub. Date: Dec. 24, 2014

(65) Prior Publication Data
US 2016/0121597 A1    May 5, 2016

(30) Foreign Application Priority Data
Jun. 18, 2013 (EP) .................................... 13172426

(51) Int. Cl.
*G03F 1/48* (2012.01)
*B41C 1/10* (2006.01)
(Continued)

(52) U.S. Cl.
CPC .......... *B41C 1/1066* (2013.01); *B41C 1/1016* (2013.01); *G03F 7/0002* (2013.01);
(Continued)

(58) Field of Classification Search
CPC .............................. G03F 7/092; B41C 1/1016
See application file for complete search history.

(56) References Cited

U.S. PATENT DOCUMENTS 6,110,642 A * 8/2000 Naruse .................... G03F 7/115
430/162
6,294,298 B1  9/2001 Denzinger et al.
(Continued)

FOREIGN PATENT DOCUMENTS

DE   199 08 529 A1   8/2000
EP   0 528 395 A1    2/1993
(Continued)

OTHER PUBLICATIONS

Official Communication issued in International Patent Application No. PCT/EP2014/062540, mailed on Aug. 21, 2014.

*Primary Examiner* — Leslie J Evanisko
*Assistant Examiner* — Michael Robinson
(74) *Attorney, Agent, or Firm* — Keating and Bennett, LLP

(57) ABSTRACT

A method for manufacturing a lithographic printing plate precursor includes the steps of providing a support as a web, coating an image recording layer on the front side of the support, and depositing a back layer on the back side of the support using a deposition technique which is capable of depositing the back layer according to a predefined image. The method enables stacking and recutting of lithographic printing plate precursors without the need for interleafs.

16 Claims, 3 Drawing Sheets

(51) Int. Cl.
*G03F 7/00* (2006.01)
*G03F 7/09* (2006.01)

(52) U.S. Cl.
CPC .......... *G03F 7/092* (2013.01); *B41C 2201/06* (2013.01); *B41C 2201/14* (2013.01)

(56) References Cited

U.S. PATENT DOCUMENTS

| | | | |
|---|---|---|---|
| 2002/0028403 A1* | 3/2002 | Elsasser | G03F 7/07 430/264 |
| 2002/0127489 A1 | 9/2002 | Denzinger et al. | |
| 2002/0170842 A1* | 11/2002 | Usui | G03C 3/00 206/449 |
| 2002/0182533 A1 | 12/2002 | Denzinger et al. | |
| 2003/0051801 A1* | 3/2003 | Usami | B41C 1/147 156/240 |
| 2012/0210893 A1* | 8/2012 | Tutt | B41C 1/05 101/395 |

FOREIGN PATENT DOCUMENTS

| | | |
|---|---|---|
| EP | 1 156 370 A1 | 11/2001 |
| EP | 1 019 254 B1 | 12/2001 |
| EP | 1 217 447 A1 | 6/2002 |
| EP | 1 239 328 A2 | 9/2002 |
| EP | 1 834 802 A1 | 9/2007 |
| EP | 1 921 501 A2 | 5/2008 |
| JP | 62-19315 A | 1/1987 |
| JP | 02-40657 A | 2/1990 |
| JP | 11-052559 A | 2/1999 |
| JP | 2002-160468 A | 6/2002 |
| JP | 2002-254843 A | 9/2002 |
| JP | 2002-333704 A | 11/2002 |
| JP | 2008-064778 A | 3/2008 |
| JP | 2011-195749 A | 10/2011 |

* cited by examiner

METHOD FOR MANUFACTURING A LITHOGRAPHIC PRINTING PLATE PRECURSOR HAVING A PATTERNED BACK LAYER

CROSS-REFERENCE TO RELATED APPLICATIONS

This application is a 371 National Stage Application of PCT/EP2014/062540, filed Jun. 16, 2014. This application claims the benefit of European Application No. 13172426.2, filed Jun. 18, 2013, which is incorporated by reference herein in its entirety.

BACKGROUND OF THE INVENTION

1. Field of the Invention

The present invention relates to a lithographic printing plate precursor.

2. Description of the Related Art

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Lithographic printing masters are generally obtained by the image-wise exposure and processing of a radiation sensitive layer on a lithographic support or by image-wise jetting of ink onto a lithographic support. Imaging and processing renders the so-called lithographic printing plate precursor into a printing plate or master. Imaging-wise exposure of the radiation sensitive coating to heat or light, typically by means of a digitally modulated exposure device such as a laser, triggers a (physico-)chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference of solubility or of rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, printing areas of the plate while the hydrophilic support is revealed by the dissolution of the coating in the developer at the non-printing areas. Generation of a lithographic printing master by image-wise jetting of ink on a lithographic support does not require a wet processing during which coating has to be dissolved in a developer. The ink receiving layer, which acts as the image recording layer, can be the surface of an anodised aluminium lithographic support optionally with a post-anodic treatment or coated with a hydrophilic layer. The jetted ink has ink-accepting properties on the press and reveals the printing areas.

In a typical industrial plate making process, the lithographic coating is applied on a support which is provided to the coating head as a web. After coating and drying, the web is sliced (cutting in the web direction) and cut (across the web) to produce individual printing plate precursors. The plates are then stacked, packed and shipped. Typically, the slicing and cutting produces upward burr, i.e. the support at the plate edges is protruding in the direction of the image recording layer, as shown in FIG. 1. In FIG. 1, the image recording layer is represented by the thin line on top of the cross-section of the lithographic printing plate precursor. During shipping, the burr often creates scratches on the surface of both sides of the plate, due to slight shifting of the plates in the stack. Another problem caused by prolonged stacking of plates is blocking, i.e. sticking of adjacent plates. Scratches or scuffs can also occur when plates are removed from the stack, either produced by burr or by the separation of sticking plates. Scratches in the image recording layer at the front side of the plate often produce visible defects in the image area.

In order to reduce the sticking of stacked plates and to avoid scratches during transport and/or plate removal, plate manufacturers have traditionally inserted paper sheets as interleaf between the stacked plates. Unfortunately, however, there are many disadvantages associated with the use of these interleaf sheets. In particular, digital plate exposure systems (commonly referred to as platesetters) are increasingly equipped with automatic plate-feeding devices and consequently, the presence of interleaf sheets creates serious complications. Such devices are designed to mechanically remove a plate from a stack and load it onto the exposure device, while additional machinery is required in order to mechanically remove the interleaf sheets. Moreover, these interleaf sheets represent an additional cost, incl. for their disposal. Therefore there is an increasing desire for the elimination of interleaf sheets in stacks of lithographic printing plate precursors.

The printing plate precursor described in JP 02/040657 A manages to be produced without the use of interleaf sheets. A UV-cured layer produced from a photopolymerisable material is located on the back side of the aluminium support. In EP 1834802 A an infrared sensitive lithographic printing plate precursor comprises on one side of a support an image recording layer and on the other side a back coat layer having a Vickers hardness of 0.2 or less. DE 19908529 A describes a printing plate precursor comprising a pigmented light-sensitive layer on one side of its support and a layer comprising an organic polymeric material having a glass transition temperature of 45° C. or above on the other side.

A lithographic plate precursor which can be stacked without the use of interleaf sheets is also described in EP 528395 A. It comprises a support made of aluminium, a layer of an organic polymeric material having a glass transition temperature of not less than 20° C. with a thickness of from 0.01 to 8.0 µm on the back side of the support and a light sensitive layer on the front side of the support. A discontinuous matting layer consisting of particles is provided on top of the light sensitive layer. The function of the matting agents is to reduce the sticking of stacked plates by allowing air inclusion between the plates. However, matting layers easily damage the image recording layer upon relative movement of stacked plates, because the matting agents are typically inorganic pigment particles of a high hardness. In addition, matting layers, in particular those comprising a particulate material having a low glass transition temperature, tend to stick to the back of the overlying plate in the stack. Besides the interaction between the matting agent and the image recording layer, additional technical problems occur in the production of pigmented back coatings. One of the disadvantages is that the solid constituents sediment very quickly, meaning that additional measures are required in order to be able to coat a homogeneous back layer.

EP1019254A discloses a lithographic printing plate precursor wherein the back side of the support is coated with an inert coating comprising a discontinuous layer obtained by coating a dispersion or spraying a powder. In EP1217447A a precursor material for the production of offset printing plates is disclosed with a continuous pigment free layer on the back side, essentially consisting of an organic polymeric material having a glass transition temperature of at least 45° C. and having a smoothness of from 5 to 800 s. In the same document, applying the back coat via spraying is disclosed. A disadvantage of spraying methods is the low yield since up to 50% of the atomised coating solution may be wasted into the environment. Furthermore there is a high risk of contaminating the manufacturing equipment.

In EP1239328A a precursor material for the production of offset printing plates is disclosed with a continuous electrically conductive back coating. The back layer is coated with a hot-melt ink comprising UV curable organic polymer with a gravure printing technique by means of engraved rollers. The surface of the back layer is smooth or structured.

EP1156370A describes a production method of a back coating of an offset plate which is light sensitive. The back coating is not subjected to image wise exposure. The invention makes it possible to cut a stack of printing plate precursors without considerable cutting burrs and damage to the knife.

Further, as disclosed in JP 62-19315A, burr is generated at the surface side of the radiation sensitive layer of a plate precursor during cutting of the precursor web. Several attempts have been made to reduce or prevent this burr in the manufacturing process, such as trimming corners of the edge portions of the support member with a file or a knife. However, printing plate precursors have to be taken out one by one to be trimmed. Therefore, this method is not appropriate for use in industrial manufacturing.

In the printing plate precursor manufacturing process, printing plate precursors often have to be re-cut after they have been stacked. Re-cutting of plate stacks is usually done with small size adaptations (typically 5 mm or less) of the plate size or plates have to be re-sized from for example an 8-up size to a typical 4-up size.

None of the prior art documents which disclose the use of back coatings in order to avoid the use of interleafs, provides a solution for the problem that, in a stack of plates, the upward burr (i.e. burr protruding towards the image recording side of the plate) which is produced by the slicing and cutting of the plates on the manufacturing line, interacts with the coating on the back side of the adjacent plate during shipping or prolonged storage. Upward burr even occurs when the cutting is carried out from the image recording side of the plate. In a stack of plates, the burr may anchor into the back coating of the adjacent plate increasing stickiness between the plates, which often leads to plate separation problems in the automatic plate loader of the platesetter.

Moreover, none of the prior art documents provides a solution for the problem that, when a stack of plates without interleaf has to be re-cut, the very strong contact between the burr produced by the high pressure during the re-cutting and the back coating of the adjacent plate results in the sticking of the plates to each other at the edges. It is therefore highly desirable to provide a solution to avoid sticking of lithographic printing plate precursors after re-cut of a stack of plates and still providing, without the need for interleaf sheets, sufficient protection of the image recording layer against mechanical damage.

SUMMARY OF THE INVENTION

Preferred embodiments of the present invention provide a solution which enables stacking and recutting of lithographic printing plate precursors without the need for interleafs and which reduces the risk that adjacent plates tend to stick to each other. A method for manufacturing a lithographic printing plate precursor is defined below. Compared to the prior art using back coatings which extend over the full area of the plate, sticking of adjacent printing plate precursors produced according to preferred embodiments of the present invention is significantly reduced without impairing the protection of the image recording layer against scratching. Also the risk of burr anchoring into the back layer, obtained according to preferred embodiments of the present invention, is significantly reduced by the lower weight and/or surface coverage of the back layer at the edges of the plate.

Other features, elements, steps, characteristics and advantages of the present invention will become more apparent from the following detailed description of preferred embodiments of the present invention. Specific embodiments of the invention are also defined in the dependent claims.

DETAILED DESCRIPTION OF THE PREFERRED EMBODIMENTS

A method for manufacturing lithographic printing plate precursors according to a preferred embodiment of the present invention comprises three essential steps: (a) providing a support as a web, coating an image recording layer on the front side of the support, and depositing a back layer on the back side of the support.

The Back Layer

Method of Making the Back Layer

A method of making the back layer according to a preferred embodiment of the present invention comprises the deposition of a liquid on the back side of the support, by a deposition technique which is capable of depositing a back layer according to a predefined image. The liquid may subsequently be solidified by phase change, curing and/or drying (regardless of the mechanism of solidification, all said liquids shall be referred to hereafter as "curable liquids"). In industrial plate manufacturing methods, the image recording layer(s) and the back layer(s) are typically applied (in any order) on a web as support and subsequently dried and cured.

In a preferred embodiment, the curable liquid is applied as a non-continuous patterned layer, e.g. as distinct dots and/or lines, or by leaving voids in the back layer (a void is to be understood as an area which does not contain any material or which contains less material than the surrounding areas). As a result, the non-continuous layer is preferably characterized by an average surface coverage. Surface coverage shall be understood as the percentage of the surface area which is covered by the back layer. Preferably, the surface coverage of the back layer has a value of 50% or less. More preferably, the dot surface coverage is 10% or less, most preferably between 1% and 5%. The average distance between the dots is preferably between 0.5 and 10.0 mm, more preferably between 1.0 and 5.0 mm, most preferably between 1.0 and 2.0 mm. The surface coverage of the back layer can be constant over the web or can have locally different values. Hence, a preferred embodiment of the invention also reduces the dry coating weight of the back layer to a minimum without impairing the protection against scratching the image recording layer, leading to an increased production speed or reduced cost of production.

Figure 1:
FIG. 1 is a cross-section of the edge of a lithographic printing plate precursor showing the burr protruding from the front side of the support, created by cutting.
Figure 2:
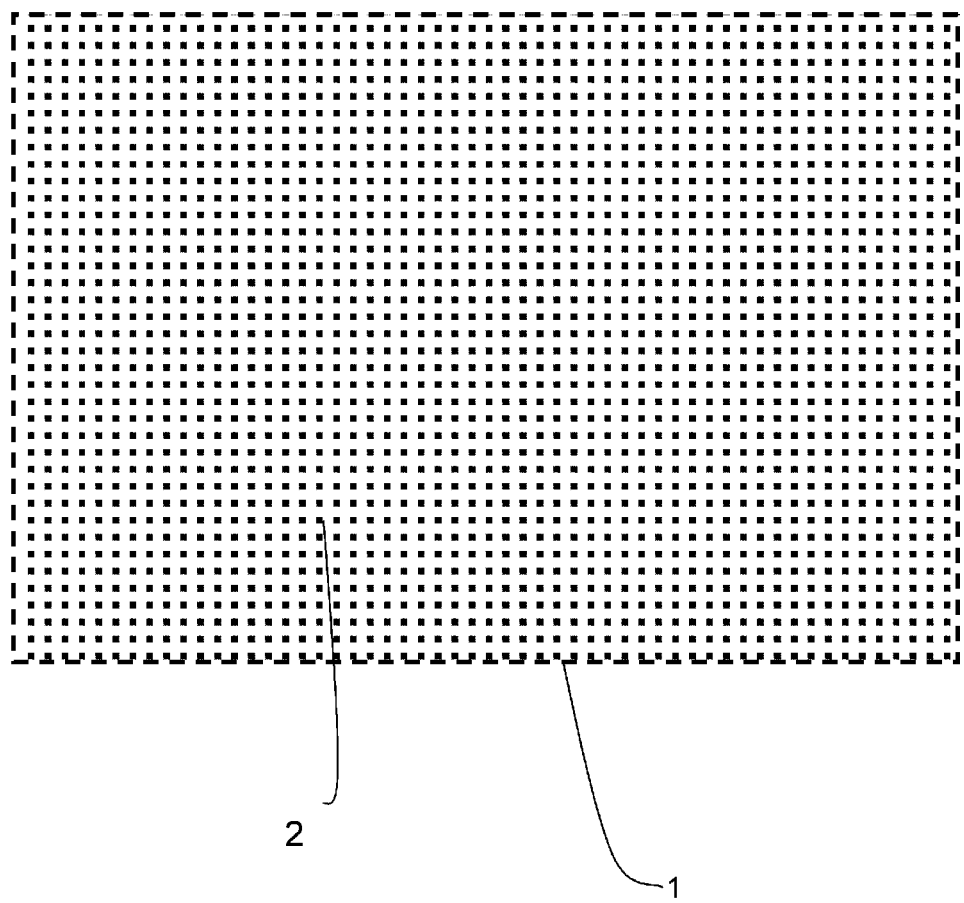
FIG. 2 is a preferred embodiment of a non-continuous back layer of a lithographic printing plate precursor, distributed as dots according to a regular pattern.

The dots, lines and/or voids of the non-continuous back layer may be arranged according to a regular pattern, comparable with an amplitude modulated half tone screen, based on a geometric and fixed spacing of dots. The spacing and dot size of these dots, lines and/or voids may vary depending on the required average surface coverage of the back layer (for example, dots or voids having a diameter or lines having a width from 10 to 200 micrometers). A preferred embodiment of the distribution of the dots is illustrated in FIG. 2. which shows the four edges 1 of a printing plate precursor and a back layer consisting of a regular pattern of dots 2. Preferably, the surface coverage of the back layer as dots in a regular pattern has a value of 50% or less. More preferably, the dot surface coverage is 10% or less, most preferably between 1% and 5%. The average distance between the dots is preferably between 0.5 and 10.0 mm, more preferably between 1.0 and 5.0 mm, most preferably between 1.0 and 2.0 mm. A regular pattern of dots can be characterised by two perpendicular axes wherein at least one axis is formed by connecting the dots with a straight line in the direction corresponding with a minimal distance between the dots.

It is preferable that lines of the pattern or the dots of the regular pattern do not coincide with one or more predefined edges. Indeed, this would increase the risk that the burr originating from the cutting would anchor in the back coating as dots or lines present at the edges. In order to avoid that the lines of the pattern coincide with the edges of the plate, the lines can be deposited in such a way that they show an angle θ greater than 0° and equal or smaller than 45° with respect to the moving direction of the web. In order to avoid that the dots of a regular pattern coincide with the edges of the plate, the dots can be deposited in such a way that the axis of the pattern which orientation is the closest with the moving direction of the web show an angle θ greater than 0° and equal or smaller than 45° with respect to the moving direction of the web. Preferably, the angle θ has a value of 15°.

Figure 3:
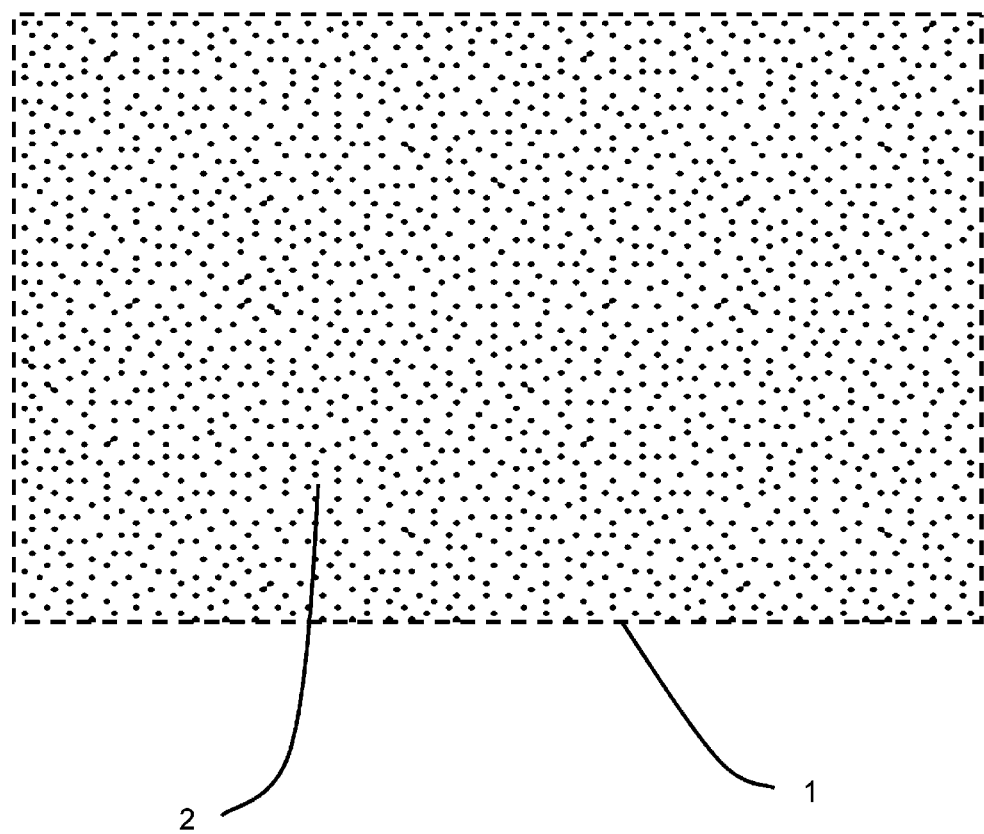
FIG. 3 is a preferred embodiment of a non-continuous back layer of a lithographic printing plate precursor, randomly distributed as dots.

In another embodiment the dots may be arranged according to stochastic screening or frequency-modulated screening using a fixed size of dots (for example, a diameter of about 25 micrometers). The distribution density of the dots may vary depending on the required average surface coverage of the back layer. A preferred embodiment of the distribution of the dots is illustrated in FIG. 3, showing the edge 1 of a printing plate precursor and the dot pattern of the back layer randomly arranged 2.

In a method of the invention, the pattern of the deposited back layers as described above is obtained by a predefined image. The predefined image contains the placement, spacing and size of the dots, voids and/or lines. The predefined image is preferably a binary image, i.e. an image which consists of pixels. The binary image may be obtained by any suitable means, e.g. it may be recovered from any image file format including vector file formats.

In a preferred embodiment of the invention, the predefined image may contain also the cutting scheme. The cutting scheme is a scheme which defines the edges, the so-called predefined edges, of the individual printing plate precursor sheets to be obtained after slicing and cutting. The scheme is typically based on the required sizes of the printing plate precursor sheets, the position in the web, and the required number of printing plates from a manufacturing batch. Based on the cutting scheme, the deposition of the back layer can be done in such a way that the back layer has an average weight and/or surface coverage at the edges of the plate sheet which is lower than the average weight and/or surface coverage of the total back layer, i.e. the average weight of the back layer over the full surface of the plate sheet after cutting. More particularly, according a method of the invention, the deposition of the back layer in production can be done in such a way that the average weight and/or surface coverage of the back layer in the sections within 1 cm from the predefined edges (hereafter also referred to as the "edge section") is lower than in the neighbouring sections in the web. The weight of the back layer is to be understood as the dry weight of the solid layer, i.e. after drying and curing of the applied liquid.

In an embodiment of the present invention, a lower average weight in the edge section(s) can be obtained by applying the curable liquid with a deposition method as described hereafter, thereby applying less material, or no material at all, near the predefined edges and obtaining a lower average layer thickness in the edge section, compared to the plate sheet as a whole.

In a preferred embodiment of the invention, the non-continuous back layer can be combined with one ore more continuous underlying layers between said back layer and the support. This can be obtained by first applying one or more continuous layers via one of the deposition methods as described below or by a conventional coating method as gravure, nip, metered roller methods, dip coating or slot coating. Subsequently the non-continuous back layer can be applied via one of the methods described below. In the embodiments comprising multiple layers at the back side of the plate, the features "average weight" shall relate to the complete back coating, i.e. the combination of all the layers provided on the back side of the support of the plate.

In order to provide sufficient protection to the image recording layer of the plate in contact with said back layer, the average thickness of the back layer and the optional underlying layer(s) is preferably more than 10 μm, more preferably more than 30 μm, most preferably between 40 and 60 μm. The average thickness of the back layer is defined as the average thickness of the back layer, measured between the top of the layer, being the combination of all the layers provided on the back side of the support of the plate, over the whole plate precursor and the bottom of the layer which contacts the support. To prevent mechanical damage of the image recording layer, the hardness of the layer preferably has a Shore A hardness of 90 or less, more preferably 85 or less. Another preferred embodiment of the invention provides compositions which lead after curing to back layers which are soft and flexible to avoid any damage of the image recording layer in contact with the back side of the plate. It is an advantage of the present invention that with the back layer, the friction coefficient of the plate precursor sheets in contact with each other can be controlled to optimise transport in the platesetter and minimise damaging of the image recording layer containing plate precursor sheets during transport.

In a preferred embodiment, the deposition of the curable liquids is directly obtained from the predefined image using a printing technique from the group of ink jet printing, valve jet printing and aerosol jetting.

In another preferred embodiment, a printing master is first made according to the predefined image. This printing master is then used to deposit the curable liquid according to gravure or screen printing techniques.

Preferred embodiments of the invention are particularly useful when stacked printing plate precursor sheets have to be re-cut. Since re-cutting usually is done with small size adaptations (typically 5 mm or less) of the plate size, the lower average weight of the back layer in the edge section(s) prevent sticking of stacked plates at the edges after re-cut. Re-cutting can also be necessary when for example plate sheets have to be re-sized from an 8-up size to a typical 4-up size. As a result, it is preferred to include additional sections having a lower average weight and/or surface coverage in the cutting scheme which are not located at the edges of the sheet that is obtained after applying the cutting scheme, but which correspond to the edges of smaller formats; as a result, re-cutting of stacked plate sheets into said smaller formats is possible without risk of sticking of adjacent printing plate precursor sheets.

After slicing and cutting, the lithographic printing plate precursors are stacked on top of each other without interleaf sheets. From these stacks packs of between 10 and 100 plates, more preferably between 30 and 50 plates are made and put in a box or sleeve, preferably a cardboard box or sleeve so as to obtain boxes of lithographic printing plates without interleaf sheets, wherein the printing plate precursors have a back layer produced according to a method of the present invention.

Deposition Techniques

Preferred deposition techniques according to the invention are 3D-printing, ink jet printing, aerosol jet printing, valve-jet printing, gravure printing and screen printing.

A. Ink Jet Printing

Ink jet printing is one of the more preferable deposition techniques to be used in the invention. The inkjet printer includes any discharging device capable of breaking up a liquid into small drops which are then directed onto the surface of the support. In the most preferred embodiment the radiation curable liquids are jetted by one or more printing heads ejecting small droplets in a controlled manner through nozzles onto the support which is moving relative to the printing head(s). A preferred printing head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the printing head creating a void, which is then filled with radiation curable liquid. When the voltage is again removed, the ceramic returns to its original shape, ejecting a drop of liquid from the print head. However the inkjet printing method is not restricted to piezoelectric inkjet printing. Other inkjet printing heads can be used and include various types, such as a continuous type and thermal, electrostatic and acoustic drop on demand types. An example of a print head according to the current invention is capable to eject droplets having a volume between 0.1 and 100 picoliter (pl) and preferably between 42 and 100 pl. EP 2420382 A, EP 2420383A, EP 2465678 A and EP 2371541A disclose preferred constellations of multiple print heads, preferably back to back print heads.

B. Aerosol Jet Printing

Another preferable deposition technique according to a method of the invention is Aerosol Jet Printing. This technique which has been developed by Optomec, preserves most of the advantages of inkjet printing, while reducing many of its limitations. The technique is disclosed in for example US 20030048314, US 20030020768, US 20030228124 and WO 2009/049072. An Aerosol Jet Print Engine is commercially available from Optomec, for example the Aerosol Jet Printer OPTOMEC AJ 300 CE. More details on the Aerosol Jet Printing technique and engine are found on the Optomec website www.optomec.com. Virtually any liquid having a viscosity less than 5000 mPa·s can be deposited using the Aerosol Jet Printing technique while inkjet printing requires liquids having a viscosity of less than 20 mPa·s. In an Aerosol Jet Printing system, rather than producing individual drops of ink, an aerosol is produced, focused and directed toward the substrate. The discharging device consists of two key components: a first module for forming an aerosol from a liquid and a second module focussing the aerosol after driving out of the nozzle and depositing the aerosol droplets on a support. Similar to continuous inkjet, this aerosol stream can be shuttered to interrupt the stream.

In Aerosol Jet Printing a collimated beam of material is discharged on a substrate. This allows the resolution to be maintained over a wide range of standoff (head to substrate) distances. This enables larger standoff distances to be used than are possible with inkjet printing. In Aerosol Jet Printing, a collimated beam of material is formed which is then deposited on the support. Therefore, standoff distances from 1 to 5 mm can be used without loss of resolution. This is important in a production environment in which supports of different thickness are used, because no adaptation to the standoff is hence required.

In Aerosol Jet Printing, two different ways of forming an aerosol can be employed, depending on the characteristics of the material to be deposited. An ultrasonic transducer can be used for nebulising low viscosity liquids (0.7 to 10 mPa·s). Here, a piezoelectric transducer produces high frequency pressure waves, which are transmitted through a coupling liquid (typically water) into the deposition liquid. For higher viscosity liquids (10 to 5000 mPa·s) or larger suspended particles (<0.5 μm) pneumatic atomization is used. In this technique, a high velocity gas stream is used to shear the liquid stream into droplets.

C. Valve-Jet Printing

Valve-jetting is a type of drop-on-demand jet technique that typically uses a discharging device with a solenoid to open and shut a valve and which is a suitable deposition technique for the invention. Valve-jet technology is described in US 2010/0132612 A. The liquid behind the valve is under pressure and as the valve is opened, a drop of the liquid is shot from the valve and travels through the nozzle to the support. The drop frequency is typically in the range from 2 to 4 kHz, although not limited tot this range. In a preferred embodiment, pressurized gas is used for driving the liquid out of the valve-jet print head. Valve-jet is a suitable deposition method to produce back layers according to the invention. The viscosity of the liquid for valve-jet printing may be higher than for ink jet printing. This leads to a broader range of useable compounds in the liquid such as oligomers and polymers compared to liquids having low viscosity requirements. The viscosity of the liquid to be jetted by valve-jet according to a preferred embodiment of the invention is preferably higher than 50 cPs, more preferably higher than 100 cPs. Valve-jet is also a suitable technique because it generates droplets with a volume in a range of 1 to 50 nl, preferably 5 to 15 nl. These drop volumes give rise to a back layer wherein the required thickness of the back layer is achieved by depositing only one layer of liquid. The less layers have to be deposited to achieve the required thickness of the back layer, the higher the throughput is of the back layer deposition process. Valve-jet print heads are known in the art and commercially available, e.g. from Matthews Swedot AB in Sweden.

D. Gravure Printing

In gravure printing technology, cells are image wise engraved into the surface of a cylinder forming a printing master. The liquid is transferred from the engraved cells to the support by a high printing pressure. With this technique, back layers with a thickness 5 to 8 µm can be obtained in one pass, meaning after one revolution of the cylinder. If higher thicknesses of the back layer are required, multiple cylinders can be arranged one after each other.

E. Screen Printing

Screen printing is a printing technique that uses a woven mesh to support a liquid-blocking stencil to receive a desired image. Since the liquid is forced through the screen, the screen printing stencil determines according to which pattern, liquid is transferred to the support. The woven mesh together with the screen printing stencil is the printing master. Following screen printing methods such as flat-to-flat method, flat-to-round method and rotary printing can be used. In a production environment, using a continuous web support, rotary screen printing is the most preferred one. Screen printing is particularly preferred due to the high layer thickness of the back layer that can thus been obtained in one single pass.

Configuration of the Discharging Devices

In a preferred embodiment of the discharging devices, the nozzles of the print heads are arranged at least over the entire width of the web. To obtain the required thickness of the back layer, the nozzle structure of the discharging devices can be constructed as to allow for a plurality of rows can be arranged in succession, the number depending on the required thickness of the back layer and the drop volume discharged by the discharging device. To build the back layer, and more specifically the non-continuous layer sufficiently efficient, the radiation source is preferably mounted next to and behind the print head. In this embodiment, the jetting heads are fixed and do not have to move back and forth over the width of the lithographic substrate.

A combination of a shuttle which carries a plurality of print heads is also a possible implementation for an arrangement to implement the invention. The shuttle moves back and forth over the width of the support. A shuttle holds the print head constellation in head positioning devices and liquids supplies for the liquid. The shuttle arranges the positioning of the head positioning devices to correct for each print head the distance between the print head and the surface of the support. A shuttle frame connects the shuttle to the base frame of the printing device. It supports accuracy less than 15 µm, preferably less than 8 µm in all positions from the shuttle to the support by comprising preferably a high resolution encoder system and preferably a linear magnetic motor. The shuttle can be moved away from the web to a maintenance purge position to inspect and service the shuttle.

A liquid supply delivers the liquid to the discharging devices in optimized conditions for jetting. The liquid supply comprises preferably a degassing unit to filter the liquid and degas the liquid below 40% and preferably a manifold wherein a static pressure is adjusted so the nozzle column in a print head is under optimal conditions which depends on the level in the manifold and the nozzle plate of the print head. The liquid supply comprises preferably a valve to prevent a print head from leaking or sucking air into the nozzles of the print head. In case of a shuttle which carries the discharging devices, the liquid supply is part of the shuttle. In one embodiment of the invention, the curing device is making part of the shuttle, assuring a short time between printing and curing.

In a preferred embodiment, 3-D printing is used to obtain a non-continuous back layer. The 3D-printing method comprises providing the predefined image consisting of a plurality of image pixels and generating an image by applying a topographic operator to the predefined image to generate for every image pixel a representation of a pixel height profile. Thereby a plurality of image layers from the filtered image is generated. The curable liquids are applied by one of the deposition techniques described above via subsequent layers corresponding with the image layers generated by the topographic operator and whereby an applied layer is preferably immobilized using a curing device before a subsequent layer is applied. The curing does not have to be a full cure, but can be a partial cure. Optionally some of the layers are not cured directly after deposition of a layer, but after deposition of a subsequent layer. In a preferred embodiment, each applied layer is immobilized using the curing device before a subsequent layer is applied. Preferably, any cross-section through a solid section of a 3-D structure at a second level in the 3-D print structure which is closer to the substrate than a first level has an area which is equal to or larger than the area of the cross-section of the 3-D structure at the first level.

Curing

Suitable methods for solidifying deposited curable liquids include thermal curing by heat or IR light and exposure to actinic radiation (e.g. UV light or electron beam radiation).

The curing of the deposited back layer can preferably be done, immediately after the deposition of the liquid by exposing the liquid to a curing source. This provides immobilization often referred to as "pinning" and may be very useful for curing droplets to build complete layers. After this pinning, a full curing can be performed.

The curing step included in a method of the invention can be "partial" or "full". The terms "partial curing" and "full curing" refer to the degree of curing, i.e. the percentage of converted functional groups, and may be determined by, for example, RT-FTIR (Real-Time Fourier Transform Infra-Red Spectroscopy) which is a method well known to the one skilled in the art of curable formulations. Partial curing is defined as a degree of curing wherein at least 5%, preferably 10%, of the functional groups in the deposited liquid is converted. Full curing is defined as a degree of curing wherein the increase in the percentage of converted functional groups with increased exposure to heat or radiation (time and/or dose) is negligible. Full curing corresponds with a conversion percentage that is within 10%, preferably 5%, from the maximum conversion percentage.

Preferably the curing process to be used in the invention is performed by UV radiation.

The curing device may be arranged in combination with the printing device, travelling therewith so that the curable liquid is exposed to curing radiation very shortly after been jetted. It may be difficult to provide a small enough radiation source connected to and travelling with the printing device. Therefore, a static fixed radiation source may be employed, e.g. a source of UV-light, which is then connected to the printing device by a flexible radiation conductor such as a fibre optic bundle or an internally reflective flexible tube.

Alternatively, a source of radiation arranged not to move with the printing device, may be an elongated radiation source extending transversely across the web based support.

Any UV light source, as long as part of the emitted light can be absorbed by the photo-initiator or photo-initiator system of the liquid droplets, may be employed as a radiation source, such as, a high or low pressure mercury lamp, a cold cathode tube, a black light, an ultraviolet light emitting diode (LED), an ultraviolet laser, and a flash light. LEDs are preferred because they allow a more compact design of the curing apparatus.

The most important parameters when selecting a curing source are the spectrum and the intensity of the UV-light. Both parameters affect the speed of the curing. Short wavelength UV radiation, such as UV-C radiation, has poor penetration capabilities and enables to cure droplets primarily on the outside. A typical UV-C light source is a low pressure mercury vapour electrical discharge bulb. Such a source has a small spectral distribution of energy, with only a strong peak in the short wavelength region of the UV spectrum. Long wavelength UV radiation, such as UV-A radiation, has better penetration properties. A typical UV-A source is a medium or high pressure mercury vapour electrical discharge bulb. Recently UV-LEDs have become commercially available which also emit in the UV-A spectrum and that have the potential to replace gas discharge bulb UV sources. By doping the mercury gas in the discharge bulb with iron or gallium, an emission can be obtained that covers both the UV-A and UV-C spectrum. The intensity of a curing source has a direct effect on curing speed. A high intensity results in higher curing speeds.

The curing speed should be sufficiently high to avoid oxygen inhibition of free radicals that propagate during curing in an addition-polymerisation process. Such inhibition not only decreases curing speed, but also negatively affects the conversion ratio of monomer into polymer. To minimize such oxygen inhibition, the imaging apparatus preferably includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 200 ppm, but are generally in the range of 200 ppm to 1200 ppm.

Another way to prevent oxygen inhibition can be achieved by a low intensity pre-exposure before the actual curing, thereby obtaining a partially cured liquid phase which is solidified but still contains residual monomer. This approach improves the adhesion properties between the layers that are subsequently deposited on top of each other. It is preferred to perform the partial curing with UV-A radiation.

A final post curing however is often realized with UV-C light or with broad spectrum UV light. Final curing with UV-C light has the property that the outside skin of the back layer is fully hardened and do not show any stickiness.

In one of the preferred embodiments, a curing station includes an UV LED bar. In the case the printing heads are configured in a shuttle, the curing station is preferably also mounted in a shuttle which follows the movement of the head(s). To prevent UV light from reaching the nozzle plates preferably anti-scattering profiles are installed, preferably tangential to the support. The UV LED bar comprises 1 or more UV LED modules which comprises one or more LED tiles which can be controlled separately. The anti-scattering profiles preferably comprise to spray a thin layer of nitrogen gas or an inert gas to decrease oxygen inhibition and to improve the curing process. To prevent the warming up of the support an air-knife may be added to the curing station that sprays compressed air directly onto the surface of the support.

The curing can also be performed by an electron beam (EB) curing station comprising an electron beam curing system that operates at a voltage that is adjustable from 125 to 150 kV. The electron beam curing system preferably provides a cure dose of 0.5 to 6 megarads (Mrads) when operating at a process speed between up to 216 m/min. EB curing may be very well suited to be used for curing in a production environment of printing plate precursors since no UV radiation is present which could irradiate the radiation sensitive layer of the printing plate precursor.

Composition of the Curable Liquids

Any of the ingredients described in sections A-E below are examples of materials which are suitable for making the curable liquid. The curable liquids may be prepared as known in the art by mixing or dispersing the ingredients together, optionally followed by milling, as described for example in EP 1637322 A paragraph [0108] and [0109].

A. Liquids Solidified by Drying

Suitable liquids contain polyolefins (such as polyethylene, polypropylene, polybutylene, polubutadiene of polyisorene), polyesters, polycarbonates, polyamides, polysiloxanes, polystyrene, homopolymers of copolymers of or with alkyl acrylate or alkyl methacrylate units (such as polymethyl methacrylate (PMMA) or styrene-methyl methacrylate copolymers), polyvinyl acetal, phenoxy resins (for example resins made from bisphenol A and epichlorohydrin), polyvinyl chloride (PVC) or polyvinylidene chloride (PVDC). Other polymers which can be used in liquids giving a microstructuration upon drying are thermoplastic elastomers. Typical thermoplastic elastomers are block- or graft copolymers having soft and hard segments which phase segregate, for example Kraton grades available from Kraton Performance Polymers Inc. and Nanostrength grades available from Arkema. The Kraton D SBS block copolymers are composed of blocks of styrene and butadiene. Kraton G polymers are second generation styrene block copolymers with a hydrogenated midblock of styrene-ethylene/butylene-styrene (SEBS) or styrene-ethylene/propylene-styrene (SEPS). Kraton FG polymers are SEBS polymers with maleic anhydride (MA) grafted onto the rubber midblock. Nanostrength® is a new family of self-assembling block copolymers comprising three linear chain blocks covalently bonded to one another. ARKEMA's commercial range of Nanostrength® "MAM" is based on symmetric acrylic triblocks containing a poly (butyl acrylate) centre block and end blocks of poly (methyl methacrylate). Another class of polymers which can be structured during physical drying are ionomers. Suitable examples for this invention are polymers with the trade name Surlyn and polymers disclosed in LANTMAN, C. W, et al. Structural Properties of Ionomers. *Annual Review of Materials Science*. August 1989, vol. 19, p. 295-317.

In another preferred embodiment of the invention, the liquid include polymer latex particles dispersed in a liquid carrier. Latex containing liquid can be heat cured to soften and flow the polymer latex particles. Latex is a liquid suspension comprising a liquid (such as water and/or other liquids) and polymeric particulates from 20 nm to 500 nm (and often from 100 nm to 300 nm) in size. Typically, the polymeric particulate can be present in the liquid from 0.5 wt % to 20 wt %. Such polymeric particulates can comprise a plurality of monomers that are typically randomly polymerized, and can also be cross linked. Additionally, in one implementation, the latex component can have a glass transition temperature from about −20 to +100 degrees C. For example, the size of the latex particles size can range from approximately 100 to 350 nanometers. For example, latex may be prepared by using emulsion polymerization of various ratios of monomer such, but are in no way limited to, methyl methacrylate, styrene, various 'soft' acrylate esters, and functionalized monomers. These functionalized monomers include 'vinyl' monomers containing hydroxyl groups, carboxylic acids, sulfonic or sulphate acids and phosphate acids, where 'vinyl' denotes derivatives of acrylates, methacrylates, functionalized styrene, allyl ether and esters, vinyl ethers as selected examples. Monomers that are often used include ethyl acrylate; ethyl methacrylate; benzyl acrylate; benzyl methacrylate; propyl acrylate; propyl methacrylate; iso-propyl acrylate; iso-propyl methacrylate; butyl acrylate; butyl methacrylate; hexyl acrylate; hexyl methacrylate; octadecyl methacrylate; octadecyl acrylate; lauryl methacrylate; lauryl acrylate; hydroxyethyl acrylate; hydroxyethyl methacrylate; hydroxyhexyl acrylate; hydroxyhexyl methacrylate; hydroxyoctadecyl acrylate; hydroxyoctadecyl methacrylate; hydroxylauryl methacrylate; hydroxylauryl acrylate; phenethyl acrylate; phenethyl methacrylate; 6-phenylhexyl acrylate; 6-phenylhexyl methacrylate; phenyllauryl acrylate; phenyllauryl methacrylate; 3-nitrophenyl-6-hexyl methacrylate; 3-nitrophenyl-18-octadecyl acrylate; ethyleneglycol dicyclopentyl ether acrylate; vinyl ethyl ketone; vinyl propyl ketone; vinyl hexyl ketone; vinyl octyl ketone; vinyl butyl ketone; cyclohexyl acrylate; methoxysilane; acryloxypropyhiethyldimethoxysilane; trifluoromethyl styrene; trifluoromethyl acrylate; trifluoromethyl methacrylate; tetrafluoropropyl acrylate; tetrafluoropropyl methacrylate; heptafluorobutyl methacrylate; iso-butyl acrylate; iso-butyl methacrylate; 2-ethylhexyl acrylate; 2-ethylhexyl methacrylate; iso-octyl acrylate; and iso-octyl methacrylate. The latexes used herein can be prepared by latex emulsion polymerization, and, in one implementation, can have a weight average molecular weight from 10,000 Mw to 5,000,000 Mw. This range is only illustrative and can be broader. Co-polymers can be formed, including block copolymers, randomly assembled copolymers, copolymers including crosslinkers, or the like. Often the copolymer is a randomly assembled copolymer, though various subclasses of each polymer type can be used, e.g., core-shell, various glass transition temperatures, surface acid groups, cross linking, etc. Also mixtures of different latexes can be used having complementary reactivity e.g. combination of a epoxy functional latex with a amino- or hydroxy functional latex forming a cross linked network upon heating due to covalent reaction or combination of an anionic and cationic latex forming a cross linked network due to ionic interaction or latex with maleimide combined with another latex with vinyltriazine forming a cross linked network due to hydrogen interaction.

B. Heat Curable Liquid

Heat curable liquids typically comprise thermoset polymers. Preferred examples of thermoset polymers are polyurethanes, novolak resins, urea formaldehyde resins, cyanate esters of polycyanurates and epoxyresins.

Other preferable polymers which can be comprised in heat curable liquids are polymers which can irreversibly cure. The curing may be done through a chemical reaction, a crosslinking reaction, which can be accelerated by heat or through a reaction initiated by a thermal initiator. The cross linking reaction occurs between crosslinkable (co-) polymers or between polymers and a cross linking agent. Crosslinkable (co-) polymers are (co-) polymers which contain a functional group (A group) and a functional group (B group) wherein both groups can react with each other and lead to a cross linking reaction upon heating. The groups A and B can be both present in the same polymer (self-cross linkable copolymers) or in a mixture of a polymers, each polymer containing a group A or B. Preferable functional groups A and B are: carbodiimide and carboxylic acid; anhydride and alcohol; anhydride and amine; isocyanate and alcohol; isocyanurate and alcohol; isocyanate and amine; epoxy and amine; epoxy and alcohol, ketone and dihydrazide. Besides the reaction between reactive polymers, curing can also take place by reaction of a polymer having a functional group such as A, B, ketone, Si-vinyl and a cross linking agent. Suitable cross linking agents are: silanes, dihydrazide, carbodiimide, isocyanates, isocyanurates, amines, alcohols, carboxylic acids, anhydrides. Curing by heat can also be obtained by using thermal initiators in combination with polymers having unsaturated groups (allyl, . . . ) or unsaturated hydrocarbons. Thermal initiator(s) suitable for use in the curable composition include tert-amyl peroxybenzoate, 4,4-azobis(4-cyanovaleric acid), 1,1'-azobis (cyclohexanecarbonitrile), 2,2'-azobisisobutyronitrile (AIBN), benzoyl peroxide, 2,2-bis(tert-butylperoxy)butane, 1,1-bis (tert-butylperoxy)cyclohexane, 1,1-Bis(tert-butylperoxy) cyclohexane, 2,5-bis(tert-butylperoxy)-2,5-dimethylhexane, 2,5-bis(tert-butylperoxy)-2,5-dimethyl-3-hexyne, bis(1-(tert-butylperoxy)-1-methylethyl)benzene, 1,1-bis(tert-butylperoxy)-3,3,5-trimethylcyclohexane, tert-butyl hydroperoxide, tert-butyl peracetate, tert-butyl peroxide, tert-butyl peroxy benzoate, tert-butylperoxy isopropyl carbonate, cumene hydro peroxide, cyclohexanone peroxide, dicumyl peroxide, lauroyl peroxide, 2,4-pentanedione peroxide, peracetic acid and potassium persulfate.

The cross linking can occur through covalent bonding/reaction but also due to hydrogen bonding or ionic interactions. Additional examples are disclosed in LABANA, S. Encyclopedia of polymer sciences and engineering. 2nd edition. New York: Wiley John, 1986. p. Vol 4, 350-390., LLOYD, William G. Thermal initiation and branching. *Chemical Technology*. March 1971, p. 176-180. and BEVINGTON, John C. Initiation of polymerization: azo compounds and peroxides. *Makromolekulare Chemie, Macromolecular Symposia*. 1987, vol. 10-11, p. 89-107.

In another preferable embodiment, thermal initiators can be combined with addition-polymerisable acrylates or methacrylates. Useful addition-polymerisable acrylates or methacrylates are described in the section of radiation curable liquids.

C. Radiation Curable Liquids

Radiation curable liquids which are suitable for the invention may comprise organic polymeric material, monomeric or oligomeric compounds which polymerize, condense or crosslink on exposure to radiation. Particularly suitable for this purpose are addition-polymerisable acrylates or methacrylates. These can be monofunctional, difunctional or multifunctional, such as ethyl (meth) acrylate, propyl (meth) acrylate, butyl (meth) acrylate, trimethylolpropane mono-, di, or tri (meth) acrylate or pentaerythritol tri (meth) acrylate. Also suitable are (meth)acrylamides, such as N-methyl-, N-propyl-, N-butyl- or N-isobutyl-(meth) acrylamide; furthermore allyl esters, such as allyl acetate; vinyl ethers, such as butyl vinyl ether, octyl vinyl ether, decyl vinyl ether, 2-methoxyethyl vinyl ether, diethylene glycol vinyl ether of benzyl vinyl ether; polyfunctional urethane acrylates. Particular suitable compounds for radiation curable liquids are: monofunctional (meth) acrylate monomers, difunctional (meth) acrylate monomers, multi functional (meth) acrylate monomers and urethane acrylate oligomers will now be described.

Monofunctional (Meth)Acrylate Monomer

Any monofunctional (meth) acrylate monomer, such as disclosed for example in EP 1637322 A, paragraph [0055], may be used.

However, the curable liquid preferably comprises a cyclic monofunctional (meth) acrylate monomer. Examples of such cyclic monofunctional (meth)acrylates are isobornyl acrylate (SR506D from Sartomer), tetrahydrofurfuryl methacrylate (SR203 from Sartomer), 4-t.butylcyclohexyl acrylate (Laromer TBCH from BASF), dicyclopentadienyl acrylate (Laromer DCPA from BASF), dioxalane functional acrylates (CHDOL10 and MEDOL10 from San Esters Corporation), cyclic trimethylolpropane formal acrylate (SR531 from Sartomer), 2-phenoxyethyl acrylate (SR339C from Sartomer), 2-phenoxyethyl methacrylate (SR340 from Sartomer), tetrahydrofurfuryl acrylate (SR285 from Sartomer), 3,3,5-trimethyl cyclohexyl acrylate (CD420 from Sartomer). Particularly preferred cyclic monofunctional (meth)acrylates monomers are isobornyl acrylate (IBOA) and 4-t.butylcyclohexyl acrylate (Laromer TBCH from BASF).

For jetting purposes, the amount of the cyclic monofunctional (meth) acrylate monomer is preferably at least 25 wt %, more preferably at least 30 wt %, relative to the total weight of the curable liquid.

Difunctional (Meth)Acrylate Monomer

A preferred difunctional (meth) acrylate monomer is a polyalkylene glycol di (meth) acrylate. Such compounds have two acrylate or methacrylate groups attached by an ester linkage at the opposite ends of a hydrophilic polyalkylene glycol. Typically, the longer the length of the polyalkylene chain, the softer and more flexible the obtained layer after curing.

Examples of such polyalkylene glycol di(meth)acrylates include:

1,3-butylene glycol diacrylate, 1,3-butylene glycol dimethacrylate, diethylene glycol diacrylate, diethylene glycol dimethacrylate, dipropylene glycol diacrylate, ethylene glycol dimethacrylate, polyethylene glycol (200) diacrylate, polyethylene glycol (400) diacrylate, polyethylene glycol (400) dimethacrylate, polyethylene glycol (600) diacrylate, polyethylene glycol (600) dimethacrylate, polyethylene glycol dimethacrylate, polypropylene glycol (400) dimethacrylate, tetraethylene glycol diacrylate, tetraethylene glycol dimethacrylate, triethylene glycol diacrylate, triethylene glycol dimethacrylate, tripropylene glycol diacrylate, tripropylene glycol diacrylate, and combinations thereof. The number between brackets in the above list refers to the Molecular Weight (MW) of the polyalkylene chain.

Highly preferred polyalkylene glycol diacrylates are polyethylene glycol diacrylates. Specific examples of commercially available polyethylene glycol diacrylate monomers include SR259 [polyethylene glycol (200) diacrylate], SR344 [polyethylene glycol (400) diacrylate], SR603 [polyethylene glycol (400) dimethacrylate], SR610 [polyethylene glycol (600) diacrylate], SR252 [polyethylene glycol (600) dimethacrylate], all Sartomer products; EBECRYL 11 [poly ethylene glycol diacrylate from Cytec; Genomer 1251 [polyethylene glycol 400 diacrylate] from Rahn. Polyethylene glycol (600) diacrylate, available as SR610 from Sartomer, is particularly preferred.

Other preferred difunctional acrylate or methacrylate monomers are e.g. butane diol diacrylate, alkoxylated hexanediol diacrylate, alkoxylated neopentyl glycol diacrylate and alkoxylated hexanediol dimethacrylate.

The amount of the difunctional (meth) acrylate monomer is preferably at least 10 wt % of the total monomer content.

Particularly preferred difunctional (meth)acrylate monomers are those according to Formula I or II,

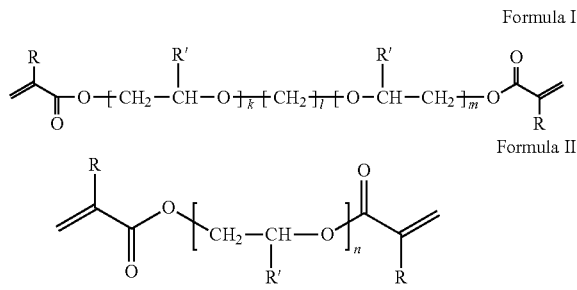

wherein k and m in Formula I is an integer ranging from 0 to 5, l in Formula I is an integer ranging from 1 to 20 n in Formula II is 1, 2, 3 or 4,

R is H or $CH_3$, and

R' is H or an alkyl group.

Difunctional (meth) acrylate monomers according to Formula I are typically derived from diols containing an $-(CH_2)-$ backbone.

Preferred compounds according to Formula I are polyoxytetramethylene diacrylate (Blemmer ADT250); 1,9 nonanediol diacrylate; 1,6 hexanediol diacrylate (SR238); 1,6 hexanediol dimethacrylate (SR239); 1,4 butanediol diacrylate (SR213); 1,2 ethanediol dimethacrylate (SR206); 1,4 butanediol dimethacrylate (SR214); ethoxylated 1,6 hexanediol diacrylate (Miramer M202)

Difunctional (meth) acrylate monomers according to Formula II are typically derived from diols containing a glycol ether backbone. The R' group in Formula II is preferably H or methyl.

Preferred compounds according to Formula II are dipropyleneglycol diacrylate (DPGDA, SR508), diethylene glycol diacrylate (SR230), triethyleneglycol diacrylate (SR272), 1,3-butylene glycol diacrylate, 1,3-butylene glycol dimethacrylate, diethylene glycol diacrylate, diethylene glycol dimethacrylate, dipropylene glycol diacrylate, ethylene glycol dimethacrylate, tetraethylene glycol diacrylate, tetraethylene glycol dimethacrylate, triethylene glycol diacrylate, triethylene glycol dimethacrylate, tripropylene glycol diacrylate, tripropylene glycol diacrylate, and combinations thereof.

The amount of the difunctional acrylate monomer according to Formula I or II is at least 1 wt %, preferably at least 5 wt %, more preferably at least 7.5 wt %, relative to the total weight of the curable liquid.

Multi Functional (Meth)Acrylate Monomer

Multi functional (meth) acrylate monomers are preferably selected from the group of tri-, tetra- or penta-functional (meth) acrylate monomers. It has been observed that the hardness of the cured layer obtained from the curable liquid becomes too high when too much tri-, tetra- or penta-functional (meth) acrylate monomer is present in the liquid. It has been observed that the maximum concentration of the tri-, tetra- or penta-functional (meth) acrylate monomer to ensure a proper hardness depends on their functionality. Typically, the higher their functionality, the lower their maximum allowable concentration to ensure a Shore A hardness below 90.

Preferably, the maximum concentration of the tri-, tetra- or penta-functional (meth)acrylate monomer, dependent on their viscosity, is as depicted in Table 1.

TABLE 1

| functionality | visco (mPa · s) | | | |
| --- | --- | --- | --- | --- |
| | <100 | 100-250 | 250-5000 | >5000 |
| 3 | 20 wt. % | 17.5 wt. % | 15 wt. % | 10 wt. % |
| 4 | 15 wt. % | 12.5 wt. % | 10 wt. % | 7.5 wt. % |
| 5 | 10 wt. % | 8 wt. % | 6 wt. % | 4 wt. % |

For the curable aerosol jet liquid, the higher viscosities are allowable as described above. Therefore, higher concentrations of multifunctional (meth) acrylate monomers may be used.

Preferred examples are ditrimethylol propane tetraacrylate (DTMPTA), glycerol triacrylate and their alkoxylated, i.e. ethoxylated or propoxylated, derivatives.

Specific compounds are trimethylol propane tetraacrylate (TMPTA), commercially available as Miramer M300; propoxylated TMPTA, commercially available as SR492; ethoxylated TMPTA, commercially available as Miramer M3130; DTMPTA, commercially available as SR355; propoxylated glyceryl triacrylate, commercially available as SR9021 and SR9020.

Other specific compounds are dipentaerythritol pentaacrylate (DIPEPA), commercially available as SR399LV; triacrylate esters of pentaerythritol, such as pentaerythritol triacrylate (PETIA); tetra-acrylate esters of pentaerythritol, such as PETRA, commercially available as SR295; ethoxylated PETRA, commercially available as SR494; alkoxylated PETRA, commercially available as Ebecryl 40.

Urethane Acrylate Oligomer

The curable liquid may further contain monofunctional urethane acrylate oligomers. Urethane acrylates oligomers are well known and are prepared by reacting polyisocyanates with hydroxyl alkyl acrylates, usually in the presence of a polyol compound. Their functionality (i.e. number of acrylate groups) varies from 1 to 6. A lower functionality results in lower reactivity, better flexibility and a lower viscosity. The polyol compound forms the backbone of the urethane acrylate. Typically the polyol compounds are polyether or polyester compounds with a functionality (hydroxyl groups) ranging from two to four. Polyether urethane acrylates are generally more flexible, provide lower cost, and have a slightly lower viscosity and are therefore preferred.

Commercially available urethane (meth)acrylates are e.g. CN9170, CN910A70, CN966H90, CN962, CN965, CN9290 and CN981 from SARTOMER; BR-3741B, BR-403, BR-7432, BR-7432G, BR-3042, BR-3071 from BOMAR SPECIALTIES CO.; NK Oligo U-15HA from SHIN-NAKAMURA CHEMICAL CO. Ltd.; Actilane 200, Actilane SP061, Actilane 276, Actilane SP063 from AKZO-NOBEL; Ebecryl 8462, Ebecryl 270, Ebecryl 8200, Ebecryl 285, Ebecryl 4858, Ebecryl 210, Ebecryl 220, Ebecryl 1039, Ebecryl 1259 and IRR160 from CYTEC; Genomer 1122 and Genomer 4215 from RAHN A.G. and VERBATIM HR50 an urethane acrylate containing liquid photopolymer from CHEMENCE.

The curable liquid preferably comprises monofunctional urethane acrylate oligomers, more preferably monofunctional aliphatic urethane acrylates, having a very low viscosity of 100 mPa·s or lower at 25° C., like for example Genomer 1122 (2-acrylic acid 2-{[(butylamino) carbonyl] oxy}ethyl ester, available from Rahn AG) and Ebecryl 1039 (available from Cytec Industries Inc.). The total amount of the monofunctional urethane acrylate oligomer is preferably at least 5 wt %, more preferably at least 7.5 wt %, relative to the total weight of the curable liquid.

The radiation curable liquid comprises an initiator which, upon exposure to radiation initiates the curing, i.e. polymerization, of the applied liquid.

However, it is also possible to carry out the curing by electron beam radiation where the presence of an initiator is not mandatory.

Preferably a photo-initiator is used which upon absorption of actinic radiation, preferably UV-radiation, forms high-energy species (for example radicals) inducing polymerization and cross linking of the monomers and oligomers of the deposited liquid.

A combination of two or more photo-initiators may be used. A photo-initiator system, comprising a photo-initiator and a co-initiator, may also be used. A suitable photo-initiator system comprises a photo-initiator, which upon absorption of actinic radiation forms free radicals by hydrogen abstraction or electron extraction from a second compound, the co-initiator. The co-initiator becomes the actual initiating free radical.

Irradiation with actinic radiation may be realized in two steps, each step using actinic radiation having a different wavelength and/or intensity. In such cases it is preferred to use 2 types of photo-initiators, chosen in function of the different actinic radiation used.

Suitable photo-initiators are disclosed in EP-A 1637926 paragraph [0077] to [0079].

To avoid extraction of the photo-initiator out of the cured back layer, copolymerizable photo-initiators (and/or co-initiators) such as disclosed in WO2012/084811 may be used. A preferred total amount of initiator is 1 to 10 wt %, more preferably 2.5 to 7.5 wt %, of the total curable liquid weight.

D. Phase Change Liquids

Phase change liquids are suitable for the invention since they solidify after jetting when contacting the support. They may comprise a low melting wax, and/or a gelling agent.

The low melting wax can comprise a polyalkylene wax, such as a polyethylene wax, a polypropylene wax, mixtures thereof, or the like. The polyalkylene wax(es) is present in any desired or effective amount. Examples of suitable polyalkylene waxes are disclosed in US 2007119340 A paragraph [0024]. The low melting wax component can also comprise functional wax(es). In one embodiment functional alcohol waxes can be employed herein. In a further embodiment the functional alcohol wax can be a mono-functional alcohol wax, a di-functional alcohol wax, a tri-functional alcohol wax, a tetra-functional alcohol wax, or mixtures thereof. Examples of suitable functional waxes are disclosed in US 2007119340 A paragraph [0027].

The phase change liquid can also include a gelling agent. The gelling agent can comprise a crystalline or semi-crystalline gelling agent. A preferred gelling agent is an ester-terminated amide. The ester-terminated amide is a semi-crystalline gelling agent that forms a clear gel. Examples of suitable ester-amide compounds and the preparation thereof are disclosed in, for example U.S. Pat. No. 5,863,319. Suitable ester-amides are also commercially available as, for example, UNI-REZ® 2980 and UNI-CLEAR® 100 (commercially available from Arizona Chemical), and the like. In one specific embodiment the urea gelling agent is a daily urea material. Specific examples of suitable urea gelling agents are disclosed in U.S. Pat. No. 5,783,657 paragraph [0032].

In order to obtain phase-change inks which can be jetted at temperatures lower than conventional jetting temperatures which exhibit robustness, that is resistance to scratch, crease and abrasion with substantially no smear, a colloidal dispersion of at least one of silica nanoparticles and metal oxide nanoparticles can be combined with the low melting wax and the gelling agent. Examples of suitable colloidal dispersions are disclosed in U.S. Pat. No. 5,783,657 paragraph [0018] and [0022].

In order to speed up the curing/solidification of the liquid upon contact with the surface of the back side of the printing plate precursor, the support can be cooled.

E. Radiation-Curable Phase-Change Liquids

Radiation curable phase change liquids comprise a vehicle and a curable solid including at least one acrylate reactive group or methacrylate reactive group.

Curable solids for use in the radiation curable compositions include radiation curable materials that are solids at room temperature and have one or more unsaturated functional groups therein, such as one or more alkene, alkyne, and acrylate or methacrylate reactive groups. In embodiments the curable solids are low molecular weight curable solids. As used herein, the term low molecular weight refers to compounds having a weight average molecular weight of about 500 Daltons or less, such as about 150 to about 450 Daltons or from about 200 to about 400 Daltons. In embodiments, the curable solid may be an alkyl acrylate, aryl acrylate, alkylaryl acrylate, aryl alkyl acrylate, alkyl methacrylate, aryl methacrylate, alkylaryl methacrylate, aryl alkyl methacrylate. Exemplary unsaturated monomers for use as curable solids are disclosed in US 20110074895 A paragraph [0033] and [0034].

The vehicle including a curable wax, a gellant, at least one photoinitiator, and optionally one or more co-monomers. The combination of the co-monomers may aid in solubilising the gellant material. The co-monomers may be chosen from any suitable radiation curable monomers. Examples of suitable curable monomers are disclosed in US 20110074895 A paragraph [0040], [0041] and [0042].

The vehicle of the radiation-curable phase-change liquid may include at least one gellant. The gellant functions to dramatically increase the viscosity of the vehicle and liquid within a desired temperature range. In particular, the gellant forms a semi-solid gel in the ink vehicle at temperatures below the specific temperature at which the ink composition is jetted. In particular, jetted radiation-curable phase-change liquid drops would be pinned into position on the support, that is at a temperature cooler than the ink-jetting temperature of the ink composition through the action of a phase-change transition in which the ink composition undergoes a significant viscosity change from a liquid state to a gel state (or semi-solid state). Gellants suitable for use are comprised of a curable amide, a curable polyamide-epoxy acrylate component and a polyamide component, a curable composite gellant comprised of a curable epoxy resin and a polyamide resin, mixtures thereof and the like, as disclosed in US 2010/304040 A. The curable gellant may also participate in the curing of monomer(s) of the composition. Amide gellants suitable for use include those described in US 2008/0122914, U.S. Pat. No. 7,276,614 B and U.S. Pat. No. 7,276,614 B.

The radiation-curable phase-change liquid preferably may include an initiator, such as, for example, a photoinitiator for assisting in curing the ink. A photoinitiator that absorbs radiation, for example UV light radiation, to initiate curing of the curable components of the ink may be used. Examples are disclosed in US 20110074895 A paragraph [0089].

To the above described liquids, additives such as plasticizers, inhibitors, oxygen inhibitors, elastomeric binders, surfactants, colorants, solvents, humectants and biocides can be added.

Plasticizer

Plasticizers may be added to the curable liquid to increase the softness and flexibility of the back layer and reduce the risk of mechanically damaging the image recording layer. Suitable plasticizers are benzyl phthalates, triaryl phosphate esters, pentaerythritol tetrabenzoate, dialkyl adipate, dialkyl phthalates, dialkyl sebacate, alkyl benzyl phthalates, ethylene glycol monostearate, glycerol monostearate, propylene glycol monostearate, dicyclohexyl phthalate, diphenyl isophthalate, triphenyl phosphate, dimethyl isophthalate, and mixtures thereof. Specific examples of commercially available plasticizers are disclosed in U.S. Pat. No. 7,276,614 B paragraph [0035] and the one disclosed in EP 1637926 A ([0085]-[0091]). However such plasticizers may migrate to the surface of the back layer and come into contact with the radiation sensitive layer. For that reason, it is preferred to use a copolymerizable plasticizing monomer such as a low Tg monomer of which the corresponding homopolymer has a glass transition temperature below −15° C. or diallylphthalate, as disclosed in EP 2466380 A.

Inhibitors

Suitable polymerization inhibitors can be added to the curable liquids to increase the shelf life of the liquids. Preferable inhibitors include phenol type antioxidants, hindered amine light stabilizers, phosphor type antioxidants, hydroquinone monomethyl ether commonly used in (meth) acrylate monomers, and hydroquinone, methylhydroquinone, t-butylcatechol, pyrogallol may be used. Of these, a phenol compound having a double bond in molecules derived from acrylic acid is particularly preferred due to its having a polymerization-restraining effect even when heated in a closed, oxygen-free environment. Suitable inhibitors are, for example, Sumilizer® GA-80, Sumilizer® GM and Sumilizer® GS produced by Sumitomo Chemical Co., Ltd. The amount of a polymerization inhibitor is generally between 200 and 20,000 ppm of the total curable liquid.

Oxygen Inhibitors

The radiation curable liquids which are based on addition polymerisation may contain compounds which decrease the polymerization inhibition of oxygen by means of radical polymerization inhibitors such as: 2-benzyl-2-dimethyl-amino-1-(4-morpholinophenyl)-butane-1 and 1-hydroxy-cyclohexyl-phenyl-ketone; 1-hydroxy-cyclohexyl-phenyl-ketone and benzophenone; 2-methyl-1[4-(methylthio) phenyl]-2-morpholino-propane-1-on and diethylthioxanthone or isopropylthioxanthone; and benzophenone and acrylate derivatives having a tertiary amino group, and addition of tertiary amines. An amine compound may commonly be employed to decrease an oxygen polymerization inhibition or to increase sensitivity. However, when an amine compound is used in combination with a high acid value compound, the storage stability at high temperature tends to be decreased.

Synergist additives may be used to improve the curing quality and to diminish the influence of the oxygen inhibition. Such additives include, but are not limited to ACTILANE® 800 and ACTILANE® 725 available from AKZO NOBEL, Ebecryl® P115 and Ebecryl® 350 available from UCB CHEMICALS and CD 1012, Craynor CN 386 (amine modified acrylate) and Craynor CN 501 (amine modified ethoxylated trimethylolpropane triacrylate) available from CRAY VALLEY. The content of the synergist additive is in the range of 0 to 20 wt %, preferably in the range of 5 to 15 wt %, based on the total weight of the curable liquid.

Elastomeric Binders

Elastomeric binders may also be comprised in the curable liquids to increase flexibility and softness of the dried or cured layer. It may be a single binder or a mixture of various binders. The elastomeric binder can be an elastomeric copolymer of a conjugated diene-type monomer and a polyene monomer having at least two non-conjugated double bonds, or an elastomeric copolymer of a conjugated diene-type monomer, a polyene monomer having at least two non-conjugated double bonds and a vinyl monomer copolymerizable with these monomers. Preferred elastomeric binders are disclosed in EP 1637926 A paragraph [0092] and [0093].

Due to their high molecular weight, the addition of elastomeric binders may cause an increase in viscosity of the curable liquid. Therefore, the amount of elastomeric binder is preferably less than 5 wt % for the liquids which are applied via inkjet. As viscosity is not an issue, more elastomeric binder, preferably more than 5 wt %, more preferably more than 10 wt %, may be used for liquids which are used with the aerosol jet technique.

Surfactants

Surfactant(s) may be added to improve the coatability, jettability and spreading on the support of the liquid. The surfactants may be anionic, cationic, non-ionic, or zwitterionic and are usually added in a total amount below 20 wt %, more preferably in a total amount below 10 wt %, each based on the total curable liquid weight.

Fluorinated or silicone compounds are preferably used as a surfactant, however, a potential drawback is bleed-out after image formation because the surfactant does not cross-link. It is therefore preferred to use a copolymerizable monomer having surface-active effects, for example, silicone-modified acrylates, silicone modified methacrylates, fluorinated acrylates, and fluorinated methacrylates.

Colorants

The curable liquids may comprise colorants to e.g. improve the visibility of the back layer. The colorants may be dyes or pigments or a combination thereof. Organic and/or inorganic pigments may be used. Suitable dyes include direct dyes, acidic dyes, basic dyes and reactive dyes. Suitable pigments are disclosed in EP 1637926 A paragraphs [0098] to [0100]. The pigment may be present in the range of 0.01 to 10 wt %, preferably in the range of 0.1 to 5 wt %, each based on the total weight of curable liquid.

Solvents

The curable liquids preferably do not contain an evaporable component, but sometimes, it can be advantageous to incorporate an extremely small amount of a solvent to improve adhesion to the support or reduce the viscosity of the liquid. In this case, the added solvent may be any amount in the range of 0.1 to 10.0 wt %, preferably in the range of 0.1 to 5.0 wt %, each based on the total weight of curable liquid.

Humectants

When a solvent is used in the curable liquids of the invention, a humectant may be added to prevent the clogging of the nozzle, due to its ability to slow down the evaporation rate of curable liquid. Suitable humectants are disclosed in EP 1637926 A paragraph [0105]. A humectant is preferably added to the curable jettable liquid formulation in an amount of 0.01 to 20 wt % of the formulation, more preferably in an amount of 0.1 to 10 wt % of the formulation.

Biocides

Suitable biocides to be used in combination with the described curable fluid include sodium dihydroacetate, 2-phenoxyethanol, sodium benzoate, sodium pyridinethion-1-oxide, ethyl p-hydroxy-benzoate and 1,2-benzisothiazolin-3-one and salts thereof. A preferred biocide is Proxel® GXL available from ZENECA COLOURS. A biocide is preferably added in an amount of 0.001 to 3 wt %, more preferably in an amount of 0.01 to 1.00 wt %, each based on the total weight of the curable liquid.

The Image Recording Layer

Suitable image recording layers of lithographic printing plate precursors have been extensively described in the patent literature and can be divided in negative working radiation sensitive and positive working sensitive layers.

Negative working plate precursors typically form an image by light- or heat-induced chemical cross linking or polymerisation of a photopolymer coating or by physical insolubilization due to heat-induced coalescence, fusing or melting of thermoplastic polymer particles. Specially designed negative plate precursor allow processing without hazardous developer, i.e. of high pH or containing a large amount of organic solvents, e.g. by using gums or a fountain solution of neutral or low pH. More details about the composition of and methods of making negative working radiation sensitive layers which are suitable examples are described in e.g. U.S. Pat. No. 4,378,564, U.S. Pat. No. 4,378,564, U.S. Pat. No. 4,378,564, EP 1349006 A, EP 1614538 A, EP 0931647 A, WO 02/21215 and EP 1817166 A.

In positive working plate precursors, the higher dissolution of non-printing areas is typically due to a kinetic differentiation of the dissolution process: the exposed areas dissolve more quickly in the developer than the non-exposed areas, so that a lithographic image is obtained after a typical development time of 15 to 30 seconds. When a typical positive plate precursor is treated with a developer for several minutes, both the exposed and the non-exposed areas dissolve in the developer and no image is formed. More details about the composition of and methods of making positive working radiation sensitive layers which are suitable examples are described in e.g. US 2009/0197206 A, EP 823327 A, WO 97/39894, EP 864420 A, WO 99/63407, EP 1826001 A, EP 901902 A, EP 909657 A and EP 1159133 A.

Also materials for making a lithographic printing master by image-wise jetting of an "ink", e.g. a curable liquid as described above, on a lithographic support benefit from the present invention. The ink receiving layer which is typically present in such materials, shall be regarded as the "image recording layer" in the meaning of the present invention. The ink receiving layer can be the surface of an anodised aluminium support optionally treated with a post-anodic treatment as described below. Another example of a suitable ink receiving layer is disclosed in WO 01/34394.

The Support

A particularly preferred support as part of the invention is a grained and anodized aluminium support. The aluminium support has usually a thickness of about 0.1-0.6 mm. However, this thickness can be changed appropriately depending on the size of the printing plate used and/or the size of the plate-setters on which the printing plate precursors are exposed. The Al support which can be used in the present invention has a thickness preferably between 0.1 mm and 0.4 mm, more preferably between 0.14 mm and 0.3 mm most preferably between 0.14 mm and 0.24 mm. The aluminium is preferably grained by electrochemical graining or mechanical treatment, and anodized by means of anodizing techniques employing phosphoric acid or a sulphuric acid/phosphoric acid mixture. Methods of both graining and anodization of aluminium are well known in the art.

By graining (or roughening) the aluminium support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean centre-line roughness Ra (ISO 4287/1 or DIN 4762) and may vary between 0.05 and 1.5 µm. The aluminium substrate of the current invention has preferably a Ra value between 0.30 µm and 0.60 µm, more preferably between 0.35 µm and 0.55 µm and most preferably between 0.40 µm and 0.50 µm. The lower limit of the Ra value is preferably about 0.1 µm. More details concerning the preferred Ra values of the surface of the grained and anodized aluminium support are described in EP 1356926 A.

By anodising the aluminium support, its abrasion resistance and hydrophilic nature are improved. The microstructure as well as the thickness of the $Al_2O_3$ layer is determined by the anodising step, the anodic weight ($g/m^2$ $Al_2O_3$ formed on the aluminium surface) varies between 1 and 8 $g/m^2$. The anodic weight is preferably between 1.5 $g/m^2$ and 5.0 $g/m^2$, more preferably 2.5 $g/m^2$ and 4.0 $g/m^2$ and most preferably 2.5 $g/m^2$ and 3.5 $g/m^2$.

The grained and anodized aluminium support may be subject to a so-called post-anodic treatment to improve the hydrophilic character of its surface. For example, the aluminium support may be silicated by treating its surface with a solution including one or more alkali metal silicate compound(s)—such as for example a solution including an alkali metal phosphosilicate, orthosilicate, metasilicate, hydrosilicate, polysilicate or pyrosilicate—at elevated temperature, e.g. 95° C. Alternatively, a phosphate treatment may be applied which involves treating the aluminium oxide surface with a phosphate solution that may further contain an inorganic fluoride. Further, the aluminium oxide surface may be rinsed with a citric acid or citrate solution, gluconic acid, or tartaric acid. This treatment may be carried out at room temperature or may be carried out at a slightly elevated temperature of about 30 to 50° C. A further interesting treatment involves rinsing the aluminium oxide surface with a bicarbonate solution. Still further, the aluminium oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde, polyacrylic acid or derivates such as GLASCOL E15™ commercially available from Ciba Speciality Chemicals. One or more of these post treatments may be carried out alone or in combination. More detailed descriptions of these treatments are given in GB 1084070 A, DE 4423140 A, DE 4417907 A, WO 01/54915, WO 00/46029, DE 4001466 A, EP 292801 A, EP 291760 A and U.S. Pat. No. 4,458,005.

In a preferred embodiment, the support is first treated with an aqueous solution including one or more silicate compound(s) as described above followed by the treatment of the support with an aqueous solution including a compound having a carboxylic acid group and/or a phosphonic acid group, or their salts. Particularly preferred silicate compounds are sodium or potassium orthosilicate and sodium or potassium metasilicate. Suitable examples of a compound with a carboxylic acid group and/or a phosphonic acid group and/or an ester or a salt thereof are polymers such as polyvinylphosphonic acid, polyvinylmethylphosphonic acid, phosphoric acid esters of polyvinyl alcohol, polyacrylic acid, polymethacrylic acid and a copolymer of acrylic acid and vinylphosphonic acid. A solution comprising polyvinylphosphonic acid or poly (meth) acrylic acid is highly preferred.

The support can also be a flexible support, which may be provided with a hydrophilic layer, hereinafter called 'base layer'. The flexible support is e.g. paper, plastic film or aluminium. Preferred examples of plastic film are polyethylene terephthalate film, polyethylene naphthalate film, cellulose acetate film, polystyrene film, polycarbonate film, etc. The plastic film support may be opaque or transparent. The base layer may be preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP 1025992 A.

A method of the present invention leads to supports of lithographic printing plate precursors having an additional advantage of a reduced weight and cost. Indeed, by depositing a back layer, according to a preferred embodiment of the invention, the thickness of the support can be reduced by a value equal to the thickness of the back layer while the total thickness of the support, being the sum in thickness of the support and the back layer, remains constant. The thickness of the support of a lithographic printing plate is mostly determined by dimensional requirements related to the used printing press, regardless how that thickness of the support is obtained. Using the back layer allows to obtain a required total thickness of the support of a lithographic printing plate precursor with a thinner support. When using Aluminium as support, one of the advantages of using a less thick Aluminium support is that cracking of the support due to mechanical stress during high run-length printing jobs is less early to occur. Furthermore, for supports made of Aluminium, the reduction of the thickness of the support can represent a considerable reduction in weight and cost. Using back layers with a surface coverage preferably lower than 10%, more preferably lower than 5%, makes it possible to achieve a required thickness of the back layer without depositing too much liquid compare to a continuous back layer. The reduced amount of liquid to be deposited at this low surface coverage of the back layer further reduces the cost of the support of the printing plate precursor.

Preferred embodiments of the invention include methods of depositing non-continuous back layers with a valve-jet on an Al support having a thickness of 0.14 mm. The liquid has a viscosity of 100 cPs or more and is cured after jetting by UV-LEDs. After jetting and curing, the back layer consists of dots placed according to a regular pattern. The back layer has an average thickness between 40 μm and 60 μm, and a surface coverage between 1 and 5% with a distance between the dots of between 1.0 and 2.0 mm. After depositing the back layer, an image recording layer is coated on the front side of the support. Another preferred embodiment of the invention includes methods to deposit dots with a valve-jet on an Al support of 0.24 mm. The liquid has a viscosity of 100 cPs or more and is cured after jetting by UV-LEDs. The dots are placed according to a regular pattern and after jetting and curing, the back layer has an average thickness between 40 μm and 60 μm, a surface coverage between 1 and 5% and a distance between the dots of between 1.0 and 2.0 mm. After depositing the back layer, an image recording layer is coated on the front side of the support. Other preferred embodiments of the invention include methods of depositing a non-continuous back layer on an Al support with a thickness of 0.24 mm. The liquid is deposited by a valve-jet and the liquid has a viscosity of 100 cPs or more. The liquid is cured by LEDs and after curing, the back layer has a shore A hardness between 80 and 90. The back layer consists of dots placed according to a regular pattern and has an average thickness between 40 μm and 60 μm, a surface coverage between 1 and 5% with a distance between the dots of between 1.0 and 2.0 mm. After depositing the back layer, an image recording layer is coated on the front side of the support.

EXAMPLES

While the present invention will hereinafter be described in connection with preferred embodiments thereof, it will be understood that it is not intended to limit the invention to those embodiments.

Preparation of the Curable Liquids

Liquid 1 was prepared by adding the ingredients listed in Table 2 into a recipient. Each ingredient is added after the previous one is completely dissolved.

TABLE 2

| Ingredient | Amount (wt. %) |
| --- | --- |
| Laromer TBCH | 22.9 |
| Miramer M202 | 13.9 |
| Mixture 1 | 9.2 |
| Sartomer SR340 | 13.9 |
| SR531 | 13.2 |
| Sartomer CD 278 | 2.3 |
| Irgacure 819 | 11.5 |
| Lucirin TPO L | 0.7 |
| EFKA 3600N | 6.0 |
| SR9035 | 6.0 |
| SR339C | 0.4 |

Liquid 2 was prepared by adding the ingredients listed in Table 3 into a recipient. Each ingredient is added after the previous one is completely dissolved.

TABLE 3

| Ingredient | Amount (wt. %) |
| --- | --- |
| Miramer M202 | 5.00 |
| SR339C | 54.5 |
| ACMO | 10.00 |
| SR531 | 14.30 |
| Mixture 1 | 0.70 |
| Sartomer CD278 | 2.70 |
| Sartomer SR9035 | 5.00 |
| IRGACURE 819 | 3.50 |

TABLE 3-continued

| Ingredient | Amount (wt. %) |
| --- | --- |
| Omnirad TPO-L | 3.5 |
| BYK UV 3510 | 0.4 |

All materials used in the examples were readily available from standard sources such as Aldrich Chemical Co. (Belgium) and Acros (Belgium) unless otherwise specified.

Laromer TBCH is a 4-t.butyl cyclohexyl acrylate from BASF

Miramer M202 is a 1,6 hexanediol (ethoxylated) diacrylate from MIWON.

Mixture 1 is a mixture of 4 wt % p-methoxyphenol, 10 wt % 2,6-di-tert-butyl-4-methylfenol and 3.6 wt % Aluminium N-nitroso-phenylhydroxylamine (available from CUPFERRON AL) in dipropylene glycol diacrylate.

Sartomer SR340, a 2-phenoxyethyl methacrylate from SARTOMER.

SR531, a cyclic trimethylolpropane formal acrylate from SARTOMER.

Sartomer CD 278, a monofunctional acrylate ester from SARTOMER.

ACMO is an acryloyl morpholine from RAHN AG

Irgacure 819 is a UV-photoinitiator from CIBA.

Lucirin TPO L, a UV-photoinitiator from BASF

Omnirad TPO L, a UV-photoinitiator from I G M RESINS BV

EFKA 3600N, a levelling agent from BASF

BYK UV 3510, polyethermodified polydimethylsiloxane wetting agent from BYK CHEMIE GMBH SR9035, ethoxylated (15) trimethylolpropane triacrylate from SARTOMER SR339C, a 2-phenoxyethyl acrylate from SARTOMER Application of the Back Layer According to a Predefined Image A non-continuous back layer was applied as follows: a printing plate precursor with a size of 30 cm×5 cm was fixed on a drum with the image recording layer in contact with the drum surface. On top of the drum, a printing station with a fixed ink jet head (CA4 print head from Toshiba Tec Corp.) was placed. The head was set in multidrop mode (8 drops per dot) to obtain drop volumes of 42 pl, the head driving voltage was 23 V and the head temperature was 45° C. The drum speed was 300 m/s, the resolution 150 dpi and the firing frequency 24.8 kHz. The jetted pattern, consisting of dots according a predefined image was instantly cured with an LED bar (at 100% LED-output 395 nm, the LEDs used were the 2UVM124 type LEDs from Baldwin Corp.) positioned directly after the ink jet head. After all the layers were jetted, the samples were additionally cured by rotating the drum for 1 minute at 100% output of the LEDs. The hardness of the obtained back layer, measured by means of the Durometer hardness test, was 84 Shore A for the back layer based on Liquid 1 and 67 Shore A for the back layer based on Liquid 2.

The predefined image was a 1-bit tiff file of 295 pixels wide and 1771 pixels long with a resolution of 150 dpi. The screen cell is made of 16 by 16 pixels. A 2 percent surface coverage corresponds with a 2 by 2 pixel dot, a 25 percent surface coverage with an 8 by 8 pixel dot, and so on. The dots were placed according to a regular pattern.

Protection against Scratching

Example 1

The back side of TPNG-TP plates (Agfa Graphics), was printed according to a method described above, wherein the print head was jetting droplets of Liquid 1. The predefined images contained regular dot patterns having average surface coverage values as listed in Table 4. The samples were pre-conditioned during 4 hours at 23° C. and a RH of 50%. Two plates were put together in such a way that the image recording layer was in contact with the back side of the adjacent plate. The two plates where then shifted one against the other at a speed of 30 mm/s. On top of the overlying plate a weight of 20 g was put to simulate the pressure during transport of a stack of plates. One couple of plates were shifted one against the other with an interleaf sheet (Pfleiderer Coral T2) in between, as a reference. The samples were then processed in an Elantrix 85 processor (Agfa Graphics) wherein the developing section was filled with 'TP developer' from Agfa Graphics. The developing conditions were a dwell time of 25 s and a temperature of 27° C. The evaluation of the scratches in the image recording layer was based on the average width of the scratches. The results are summarised in Table 4.

TABLE 4

| Number of jetted layers | Average surface coverage in % | | Width of scratches (μm) |
|---|---|---|---|
| 0 | 0 | Comp. | 52 |
| 0 (with interleaf sheet) | 0 | Reference | 0 |
| 5 | 75 | Inv. | 31 |
| 5 | 50 | Inv. | 10 |
| 5 | 25 | Inv. | 21 |
| 5 | 2 | Inv. | 1 |
| 10 | 90 | Inv. | 0 |
| 10 | 75 | Inv. | 0 |
| 10 | 50 | Inv. | 0 |
| 10 | 25 | Inv. | 0 |
| 10 | 2 | Inv. | 0 |
| 25 | 90 | Inv. | 0 |
| 25 | 75 | Inv. | 0 |
| 25 | 50 | Inv. | 0 |
| 25 | 25 | Inv. | 0 |
| 25 | 2 | Inv. | 0 |

From these results, it can be seen that with a back layer obtained by jetting drops of Liquid 1 in at least 10 layers on top of each other, the level of scratches of the image recording layer is equal to the level of scratches when an interleaf sheet is used between the back side of the support and the image recording layer.

Example 2

The back side of 'Elite Pro' plates (Agfa Graphics), was printed as described in example 1, using Liquid 1 and Liquid 2 as curable liquids. The test in which the plates were shifted one against the other was identical to the test in example 1. After the scratching, the samples were processed in an Elantrix 85 processor (Agfa Graphics) wherein the developing section was filled with 'Energy Elite Improved Developer' from Agfa Graphics. The developing conditions were a dwell time of 18 s and a temperature of 22° C. The evaluation of the scratches in image recording layer was done by visual inspection. 0: no damage of the image recording layer visible, 1: superficial damage of the image recording layer is visible, 2: shallow scratches in the image recording layer, 3: deep scratches in the image recording layer. The results are summarised in Table 5.

TABLE 5

| Number of jetted layers | Average surface coverage in % | Liquid | Scratch level |
|---|---|---|---|
| 0 | | Comp. | 3 |
| 0 (with interleaf sheet) | 0 | Reference | 2 |
| 15 | 2 | Inv. 1 | 0 |
| 15 | 10 | Inv. 1 | 0 |
| 15 | 25 | Inv. 1 | 1 |
| 15 | 50 | Inv. 1 | 1 |
| 25 | 2 | Inv. 1 | 1 |
| 25 | 10 | Inv. 1 | 1 |
| 25 | 25 | Inv. 1 | 1 |
| 25 | 50 | Inv. 1 | 1 |
| 15 | 2 | Inv. 2 | 0 |
| 15 | 10 | Inv. 2 | 2 |
| 15 | 25 | Inv. 2 | 1 |
| 15 | 50 | Inv. 2 | 2 |
| 25 | 2 | Inv. 2 | 0 |
| 25 | 10 | Inv. 2 | 1 |
| 25 | 25 | Inv. 2 | 0 |
| 25 | 50 | Inv. 2 | 2 |

From these results, it can be seen that with a back layer obtained by jetting drops of Liquid 1 or 2 in at least 15 layers on top of each other, the level of scratches of the image recording layer is equal or lower than the level of scratches when an interleaf sheet is used between the back side of the support and the image recording layer.

Friction Coefficient

Example 3

Changing the thickness and the surface coverage of the non-continuous back layer makes it possible to change the static and dynamic friction coefficient as can bee seen in Table 6. To prove this, the friction coefficient of the plates obtained in examples 1, with the image recording layer contacting the back side of the overlying plate, has been measured. The measurement of the friction coefficient is done according to the method ISO 8295:1995.

TABLE 6

| Number of layers | Average surface coverage in % | Static friction coefficient | Dynamic friction coefficient |
|---|---|---|---|
| 0 | 0 | 0.32 | 0.29 |
| 5 | 2 | 0.5 | 0.53 |
| 5 | 25 | 0.77 | 0.77 |
| 5 | 50 | 0.88 | 0.71 |
| 5 | 75 | 0.77 | 0.71 |
| 5 | 90 | 0.77 | 0.7 |
| 10 | 2 | 0.66 | 0.59 |
| 10 | 25 | 1.2 | 1.01 |
| 10 | 50 | 1.27 | 1.05 |
| 10 | 75 | 1.95 | 1.11 |
| 10 | 90 | 1.92 | 1.01 |
| 25 | 2 | 1.04 | 0.68 |
| 25 | 25 | 2.53 | 1.28 |
| 25 | 50 | 2.7 | 1.07 |
| 25 | 75 | 2.8 | 1.25 |
| 25 | 90 | 2.71 | 1.46 |

To reduce the creation of scuffs due to movement of the plates over each other during transport, it is favourable that the friction coefficient is not too low. Monitoring the friction coefficient by means of the surface coverage and/or thickness of the back layer is an important advantage of the invention.

Stickiness

Example 4

The back side of N94 VCF plates (Agfa Graphics), was printed in the same way as in example 1. The comparison sample (COMP-1) was obtained by coating the back side of the N94 VCF plates (Agfa Graphics) having a size of 24 cm×44 cm with Liquid 1. The coating was done by a wired coating bar to obtain a back layer with a thickness of 15 µm after curing. The curing was done with UV-A light (light box equipped with 8 Philips TL 20 W/10 UVA ($\lambda_{max}$=370 nm) lamps; the distance between the sample and the lamps was ±10 cm). The samples were stacked with the image recording side against the back side of the overlying plate and the stack was put at 30% of RH and 85% of RH, placed under a pressure of 2500 kg for 10 minutes to simulate prolonged storage conditions of a stack of plates in a warehouse. After this test, the plates were un-stacked and the stickiness was evaluated. The degree of stickiness corresponds with a ranking from 1 (no stickiness at all) to 4 (very sticky and transfer of deposited material from the back side to the image recording layer side). The results are summarized in Table 7.

TABLE 7

| Average surface coverage (%) | 30% of RH | 85% of RH |
|---|---|---|
| 100 (COMP-1) | 2 | 3 |
| 25 (INV.) | 4 | 4 |
| 2 (INV.) | 1 | 1 |

At low surface coverage, a non-continuous back layer shows a reduced stickiness with respect to a uniform coating on the back side.

Example 5

The back side of TPNG-TP plates (Agfa Graphics), was printed in the same way as in example 4. The comparison sample (COMP-2) was obtained the same way as in example 4. The samples were stacked in identical conditions as in example 4. The sticking power was measured by pulling apart the sandwiches at an angle of 180° with the Instron 33R69 pull bank at a speed of 10 mm/min. The results are summarised in Table 8.

TABLE 8

| Average surface coverage in % | | Sticking power |
|---|---|---|
| 2 | Inv. | None |
| 25 | Inv. | Too low to measure |
| 30 | Inv. | Too low to measure |
| 40 | Inv. | Too low to measure |
| 50 | Inv. | Too low to measure |
| 100 | COMP-2 | 510N |

The results show that a non-continuous back layer, deposited according to a preferred embodiment of the invention shows a strong reduction in stickiness of the plates in a stack compared to a back layer applied via a coating technique which is not capable of depositing liquids according to a predefined image.

Example 6

Two aluminium plates, having a thickness of 0.140 mm and a thickness of 0.190 mm, are grained and anodised the same way as described in [0098] of EP2366545A. Onto the front side of the two grained and anodised aluminium supports a coating solution having the composition CS-01 as described in EP2366545A was coated and dried as described in [0099-0100] of EP2366545A. The coated printing plate precursors were cut into plates having a length of 210 mm and a width of 22 mm. Onto the back side of the printing plate precursor having an aluminium support with a thickness of 0.140 mm, a back layer was deposited according to the method described in Example 1. The print head was jetting droplets of Liquid 2 and 15 layers were jetted on top of each other. The thickness of the back layer, measured from the surface of the support to the top of the dots was 50 µm. The predefined image contained a regular dot pattern as described above and the surface coverage of the back layer is 2%. The axis of the regular dot pattern which orientation is the closest with the longest edge of the plate, shows an angle of 15° with the edge of the printing precursor plate. The total thickness of the support being the sum of the aluminium support and the back layer is hence: 0.190 mm. This sample is called the inventive sample. The sample of the printing plate precursor having an aluminium support of 0.190 mm is hereafter denoted as the comparative sample. The total thickness of the support of both samples is thus equal to 0.190 mm. The samples were pre-conditioned during 4 hours at 23° C. and a RH of 50%. Both samples were placed between 2 steel rollers having a diameter of 50 mm. The samples were bend mechanically with both ends toward the surface of one roller and subsequently bend toward the surface of the second roller with a frequency of 20 bending movements per minute. The average number of cycles at which cracking of the aluminium support occurred was for the comparative sample 30.000 cycli and for the inventive plate precursor sample 22.000 cycli. These results show that the durability of the lithographic printing plate with a back layer according to a preferred embodiment of the invention in long run length print jobs will be higher than with a lithographic printing plate without a back layer for the same total thickness of the support.

The invention claimed is:

1. A method for manufacturing a lithographic printing plate precursor, the method comprising the steps of:
   providing a support as a web, the support including a front side and a back side;
   coating an image recording layer on the front side of the support; and
   depositing a non-continuous back layer on the back side of the support according to a predefined image the predefined image including a cutting scheme defining predefined cutting edges of the lithographic printing plate precursor; and
   slicing and cutting the web along the predefined cutting edges;
   wherein the non-continuous back layer has a lower average surface coverage in sections within 1 cm of the predefined cutting edges than in neighboring sections of the web.

2. The method according to claim 1, wherein the step of depositing the non-continuous back layer comprises the steps of:
   (i) applying a curable liquid with a depositing technique selected from the group consisting of ink jet printing, valve jet printing, and aerosol jetting; and
   (ii) at least partially curing the applied curable liquid.

3. The method according to claim 2, wherein the at least partially cured applied curable liquid has a Shore A hardness of 90 or less.

4. The method according to claim 2, wherein the curable liquid applied in the applying step is cured by ultra violet light or electron beam radiation.

5. The method according to claim 4, wherein the predefined image includes a regular pattern of dots, lines, voids, or a combination thereof; and
the regular pattern does not coincide with the predefined cutting edges.

6. The method according to claim 4, wherein the predefined image includes randomly distributed dots, lines, voids, or a combination thereof.

7. The method according to claim 2, wherein the curable liquid applied in the applying step is a phase-change liquid that is cured by ultra violet light.

8. The method according to claim 2, further comprising the step of:
depositing and curing droplets of the curable liquid on the at least partially cured droplets by repeating steps (i) and (ii).

9. The method according to claim 2, wherein the predefined image includes a regular pattern of dots, lines, voids, or a combination thereof; and
the regular pattern does not coincide with the predefined cutting edges.

10. The method according to claim 2, wherein the predefined image includes randomly distributed dots, lines, voids, or a combination thereof.

11. The method according to claim 1, wherein the non-continuous back layer includes a plurality of dots, lines, voids, or a combination thereof.

12. The method according to claim 1, wherein one or more continuous layers are applied between the non-continuous back layer and the back side of the support.

13. The method according to claim 1, wherein the predefined image includes a regular pattern of dots, lines, voids, or a combination thereof; and
the regular pattern does not coincide with the predefined cutting edges.

14. The method according to claim 1, wherein the predefined image includes randomly distributed dots, lines, voids, or a combination thereof.

15. The method according to claim 1, wherein the non-continuous back layer has a lower average weight in the sections within 1 cm of the predefined cutting edges than in the neighboring sections of the web.

16. The method according to claim 1, further comprising the steps of:
stacking printing plate precursor sheets obtained by the step of slicing and cutting the web to define a stack of printing plate precursor sheets; and
re-cutting the stack of printing plate precursor sheets.

* * * * *